United States Patent
Chiang et al.

(10) Patent No.: US 10,957,945 B2
(45) Date of Patent: Mar. 23, 2021

(54) BATTERY STATE DETECTION METHOD AND SYSTEM THEREOF

(71) Applicant: Ablerex Electronics Co., Ltd., New Taipei (TW)

(72) Inventors: Wen-Jung Chiang, Kaohsiung (TW); Tsung-Hsien Lin, Kaohsiung (TW); Jhih-Hao Chen, Kaohsiung (TW); Yu-Hsiu Lin, Kaohsiung (TW)

(73) Assignee: ABLEREX ELECTRONICS CO., LTD., New Taipei (TW)

(*) Notice: Subject to any disclaimer, the term of this patent is extended or adjusted under 35 U.S.C. 154(b) by 0 days.

(21) Appl. No.: 15/462,265

(22) Filed: Mar. 17, 2017

(65) Prior Publication Data
US 2018/0205121 A1    Jul. 19, 2018

(30) Foreign Application Priority Data

Jan. 17, 2017    (TW) .................... 106101553

(51) Int. Cl.
| | |
|---|---|
| *H01M 10/44* | (2006.01) |
| *H01M 10/48* | (2006.01) |
| *H02J 7/00* | (2006.01) |
| *G01R 31/36* | (2019.01) |
| *G01R 31/367* | (2019.01) |
| *G01R 31/382* | (2019.01) |
| *G01R 31/389* | (2019.01) |

(Continued)

(52) U.S. Cl.
CPC .......... *H01M 10/44* (2013.01); *G01R 31/367* (2019.01); *G01R 31/382* (2019.01); *G01R 31/389* (2019.01); *G01R 31/392* (2019.01); *H01M 10/48* (2013.01); *H02J 7/0063* (2013.01); *H01M 2010/4271* (2013.01); *H01M 2010/4278* (2013.01); *H01M 2220/10* (2013.01); *H01M 2220/20* (2013.01)

(58) Field of Classification Search
CPC ................. H01M 10/44; H01M 10/48; H01M 2010/4271; H01M 2010/4278; H02J 7/0063; G01R 31/3606; G01R 31/3651; G01R 31/3662; G01R 31/3679
See application file for complete search history.

(56) References Cited

U.S. PATENT DOCUMENTS

| | | | |
|---|---|---|---|
| 6,031,354 A * | 2/2000 | Wiley ................ | G01R 31/3648 320/116 |
| 8,878,489 B2 | 11/2014 | Chou et al. | |

(Continued)

*Primary Examiner* — Manuel L Barbee
(74) *Attorney, Agent, or Firm* — Che-Yang Chen; Law Office of Michael Chen (57) ABSTRACT

A battery state detection method includes: presetting at least one discharge method and at least one discharge condition of a battery set for estimating a battery state, with the discharge condition including a discharge voltage, discharge time or a relative battery impedance variation; executing a partial discharge procedure of the battery set and measuring partial discharge data; and directly calculating battery state data of the partial discharge data under the discharge method and the discharge condition. The battery state data include a SOH (state of health) datum, a SOC (state of charge) datum or a residual discharging time datum. The detection of the battery set is suitable for a manual operation system, a remote control monitoring system or an automatic scheduling system.

26 Claims, 5 Drawing Sheets

(51) Int. Cl.
    *G01R 31/392*     (2019.01)
    *H01M 10/42*     (2006.01)

(56) References Cited

U.S. PATENT DOCUMENTS

| | | | |
|---|---|---|---|
| 9,248,746 B2 * | 2/2016 | Wen | H01M 10/425 |
| 2014/0088896 A1 * | 3/2014 | Hu | G01R 31/3651 |
| | | | 702/63 |
| 2014/0153134 A1 | 6/2014 | Han et al. | |
| 2014/0253134 A1 | 9/2014 | Teng | |

\* cited by examiner

BATTERY STATE DETECTION METHOD AND SYSTEM THEREOF

BACKGROUND OF THE INVENTION

1. Field of the Invention

The present invention relates to a battery state detection method and system thereof. Particularly, the present invention relates to the battery state detection method and system thereof by partial discharge.

2. Description of the Related Art

U.S. Pat. No. 9,248,746, entitled "Abnormal Detection System and Detection Method of Battery Module," discloses an abnormal battery detecting system and method for an electric vehicle. The abnormal battery detecting system is suitable for an electric vehicle and includes a power supply unit, a displaying unit, a battery module, a safety protection unit, a detecting unit, and a controlling unit.

The battery module is a main power source of the electric vehicle. The safety protection unit connects with the battery module and the power supply unit. The detecting unit connects with the battery module and the power supply unit for detecting the battery module. If the battery module is abnormal, the detecting unit generates at least one feedback signal that is received by the controlling unit. The controlling unit compares the feedback signal with at least one preset default value and generates an abnormal level signal to the displaying unit and the safety protection unit. The safety protection unit is selectively enabled to control an operation of the battery module according to the abnormal level signal. In fact, the battery detecting method provides an abnormal feedback signal which is only suitable for detecting abnormal batteries.

U.S. Patent Application Publication No. 20140253134, entitled "Electronic Device and Method for Detecting the Amount of Charge of a Battery," discloses an electronic device and method for detecting the amount of charge of a battery. The electronic device includes a battery, a detector, and a processor.

The battery provides the electric energy needed by the electronic device, and the detector detects a parameter of the battery. The parameter is related to the amount of charge of the battery. The detector sends a signal when the parameter changes. The processor obtains the parameter from the detector in response to the signal. However, the electronic device and method are only suitable for detecting the amount of charge of a battery.

U.S. Pat. No. 8,878,489, entitled "Estimation Method for Residual Discharging Time of Batteries," discloses an estimation method for residual discharging time of batteries. The estimation method includes the steps of: providing a set of battery-discharge-current intervals and a set of battery-discharge equations; setting a discharge time of each battery-discharge-current intervals to zero; detecting a discharge current, voltage and time of batteries; judging whether the discharge current exceeds all of the battery-discharge-current intervals; selecting one of the battery-discharge-current intervals and the associated battery-discharge equation according to the detected discharge current; calculating an estimation of residual discharging time; accumulating and recording the discharge time; judging whether the discharge voltage is lower than a predetermined value and calculating an estimation error of the residual discharging time; and adjusting parameters of the battery-discharge equation for reducing the estimation error of the residual discharging time if the estimation error is greater than a predetermined error value. However, the estimation method requires many numbers of battery-discharge-current intervals and battery-discharge equations which will result in complicating the entire estimation process.

However, there is a need of improving and simplifying a conventional fuel cell power system for supplying emergency power to power-consuming devices. The above-mentioned patent and patent publications are incorporated herein by reference for purposes including, but not limited to, indicating the background of the present invention and illustrating the situation of the art.

As is described in greater detail below, the present invention provides a battery state detection method and system thereof. At least one discharge mode and at least one discharge condition of a battery set is preset to execute an initially partial discharge procedure of the battery set and to measure initially partial discharge data. According to the initially partial discharge data, a primarily partial discharge procedure is further executed, and the primarily partial discharge data is measured to estimate a battery state data in such a way to simplify a battery state detection process, to reduce a detection time, and to lower detection cost.

SUMMARY OF THE INVENTION

The primary objective of this invention is to provide a battery state detection method and system thereof. At least one discharge mode and at least one discharge condition of a battery set is preset to execute an initially partial discharge procedure of the battery set and to measure the initially partial discharge data. According to the initially partial discharge data, a primarily partial discharge procedure is further executed, and the primarily partial discharge data is measured to estimate a battery state data. Advantageously, the battery state detection method and system of the present invention are successful in simplifying a detection process, reducing a detection time, and lowering detection cost.

The battery state detection method in accordance with an aspect of the present invention includes:

presetting at least one discharge mode and at least one discharge condition of a battery set for estimating a battery state with a partial discharge manner;

executing an initially partial discharge procedure of the battery set for a first predetermined discharge time with a first predetermined discharge voltage or a first predetermined relative variation of battery impedance, and measuring the initially partial discharge data to verify a normal or abnormal state of the battery set;

executing a primarily partial discharge procedure of the battery set for a second predetermined discharge time with a second predetermined discharge voltage or a second predetermined relative variation of battery impedance when the battery set is normal, and measuring the primarily partial discharge data; and directly calculating an estimated battery state data with the primarily partial discharge data with the at least one discharge mode and the at least one discharge condition.

In a separate aspect of the present invention, the battery state includes a state of health, a state of charge, a residual discharge time or combinations thereof.

In a further separate aspect of the present invention, the battery set includes a lead-acid battery set, an aqueous hybrid iron battery set, a silicon carbide battery set, a nickel manganese cobalt lithium battery set or a lithium-iron battery set.

In yet a further separate aspect of the present invention, the battery set is arranged in an uninterruptible power supply system, a switching mode rectifier system, a backup power supply system, an energy storage system or an energy recycle system.

In yet a further separate aspect of the present invention, the discharge mode includes a predetermined voltage mode, a predetermined current mode, a predetermined power mode, an unvaried power mode or combinations thereof.

In yet a further separate aspect of the present invention, the discharge condition includes a discharge voltage, a discharge time, a relative variation of battery impedance or combinations thereof.

In yet a further separate aspect of the present invention, the estimated battery state data is verified by a battery state data which is discharged to a terminal voltage under the at least one discharge condition.

The battery state detection method in accordance with another aspect of the present invention includes:

presetting at least one discharge mode and at least one discharge condition of a battery set for estimating a battery state with a partial discharge manner;

executing an initially partial discharge procedure of the battery set for a first predetermined discharge time with a first predetermined discharge voltage or a first predetermined relative variation of battery impedance, and measuring the initially partial discharge data to verify a normal or abnormal state of the battery set;

executing a first partial discharge procedure of the battery set for a second predetermined discharge time with a second predetermined discharge voltage or a second predetermined relative variation of battery impedance when the battery set is normal, and measuring a first partial discharge data;

executing a second partial discharge procedure of the battery set for a third predetermined discharge time with a third predetermined discharge voltage or a third predetermined relative variation of battery impedance, and measuring a second partial discharge data; and directly calculating an estimated battery state data with the first partial discharge data and/or the second partial discharge data with the at least one discharge mode and the at least one discharge condition.

In a separate aspect of the present invention, the battery state includes a state of health, a state of charge, a residual discharge time or combinations thereof.

In a further separate aspect of the present invention, the battery set includes a lead-acid battery set, an aqueous hybrid iron battery set, a silicon carbide battery set, a nickel manganese cobalt lithium battery set or a lithium-iron battery set.

In yet a further separate aspect of the present invention, the battery set is arranged in an uninterruptible power supply system, a switching mode rectifier system, a backup power supply system, an energy storage system or an energy recycle system.

In yet a further separate aspect of the present invention, the at least one discharge mode includes a predetermined voltage mode, a predetermined current mode, a predetermined power mode, an unvaried power mode or combinations thereof.

In yet a further separate aspect of the present invention, the at least one discharge condition includes a first discharge condition and a second discharge condition which includes a discharge voltage, a discharge time, a relative variation of battery impedance or combinations thereof.

In yet a further separate aspect of the present invention, the estimated battery state data is verified by a battery state data which is discharged to a terminal voltage under the first or second discharge condition.

The battery state detection system in accordance with an aspect of the present invention includes:

a battery set provided in a predetermined device;

at least one power charge/discharge device having a control unit electrically connected with the battery set; and a battery managing system electrically connected with the power charge/discharge device, with at least one discharge mode and at least one discharge condition of the battery set preset in the battery managing system;

wherein an initially partial discharge procedure of the battery set is executed for a first predetermined discharge time with a first predetermined discharge voltage or a first predetermined relative variation of battery impedance via the power charge/discharge device;

wherein initially partial discharge data is measured to verify a normal or abnormal state of the battery set by the power charge/discharge device;

wherein a primarily partial discharge procedure of the battery set is executed for a second predetermined discharge time with a second predetermined discharge voltage or a second predetermined relative variation of battery impedance via the power charge/discharge device when the battery set is normal, and primarily partial discharge data is measured by the power charge/discharge device; and wherein an estimated battery state data is directly calculated by the primarily partial discharge data with the discharge mode and the discharge condition.

In a separate aspect of the present invention, the battery state includes a state of health, a state of charge, a residual discharge time or combinations thereof.

In a further separate aspect of the present invention, the battery set includes a lead-acid battery set, an aqueous hybrid iron battery set, a silicon carbide battery set, a nickel manganese cobalt lithium battery set or a lithium-iron battery set.

In yet a further separate aspect of the present invention, the battery set is arranged in an uninterruptible power supply system, a switching mode rectifier system, a backup power supply system, an energy storage system or an energy recycle system.

In yet a further separate aspect of the present invention, the discharge mode includes a predetermined voltage mode, a predetermined current mode, a predetermined power mode, an unvaried power mode or combinations thereof.

In yet a further separate aspect of the present invention, the discharge condition includes a discharge voltage, a discharge time, a relative variation of battery impedance or combinations thereof.

In yet a further separate aspect of the present invention, the estimated battery state data is verified by a battery state data which is discharged to a terminal discharge voltage under the discharge condition.

In yet a further separate aspect of the present invention, the battery managing system includes a battery data collector connected thereto.

In yet a further separate aspect of the present invention, the battery managing system or the battery data collector connects with a remote monitoring and battery diagnosis system.

Further scope of the applicability of the present invention will become apparent from the detailed description given hereinafter. However, it should be understood that the detailed description and specific examples, while indicating preferred embodiments of the invention, are given by way of illustration only, since various modifications will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

It is noted that a battery state detection method and system thereof in accordance with the present invention can be applicable for various lead-acid batteries, lithium-iron batteries or other similar batteries and is suitable for detecting a battery state of health (SOH), a battery state of charge (SOC), a residual discharge time or other battery state, for example, which are not limitative of the present invention.

Figure 1:
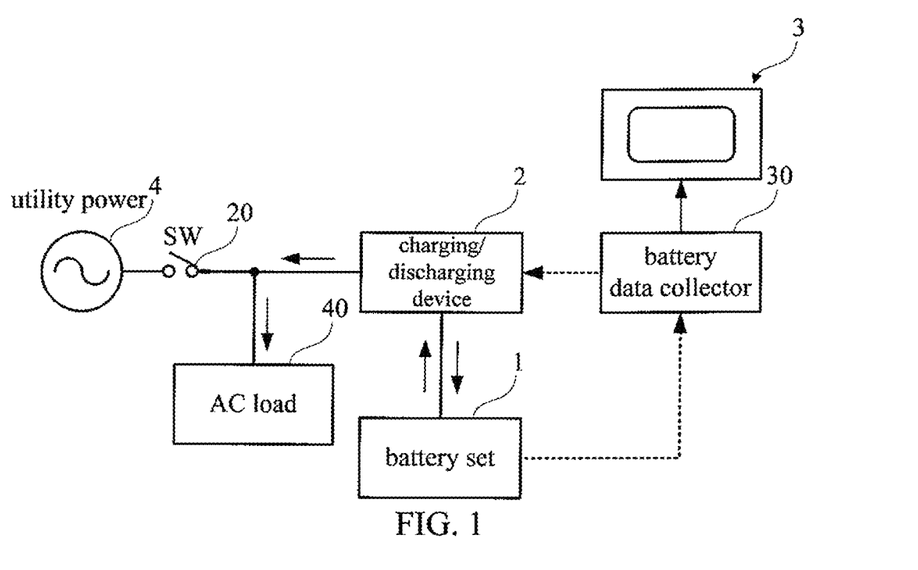
FIG. 1 is a block diagram of a battery state detection system in accordance with a first preferred embodiment of the present invention.

FIG. 1 shows a block diagram of a battery state detection system in accordance with a first preferred embodiment of the present invention. Referring now to FIG. 1, the battery state detection system of the first preferred embodiment of the present invention includes a plurality of battery sets 1, a plurality of power charge/discharge devices 2 and a battery management system (BMS) 3 which are configured to form a manual operation monitoring system, a remote monitoring system, an automatic time-schedule control system or other operational control system. The battery state detection system is suitable for remotely executing a large area-wide automatic control, detection and monitoring to save manpower and operation time.

With continued reference to FIG. 1, by way of example, the battery set 1 includes a lead-acid battery set, an aqueous hybrid iron battery set, a silicon carbide battery set, a nickel manganese cobalt lithium battery set or a lithium-iron battery set which is suitable for executing at least one of a state of health, a state of charge and residual discharge time. However, various brands of the battery sets 1 usually possess different characteristics of power charge and discharge.

With continued reference to FIG. 1, by way of example, the battery set 1 and the power charge/discharge devices 2 are provided in a predetermined electric facility or a predetermined emergency electric facility. The power charge/discharge devices 2 electrically connects with the battery set 1 for automatically or manually executing a power charge, a power discharge or testing, as indicated at the directions of arrows in FIG. 1. The battery set 1 and the power charge/discharge devices 2 are arranged in an uninterruptible power supply (UPS) system, a switching mode rectifier (SMR) system, a backup power supply system, an energy storage system or an energy recycle system which includes a switch 20 to connect with or to disconnect from a utility power system 4. In a preferred embodiment, a control unit of the power charge/discharge devices 2 controls the battery set 1 to discharge to an AC load 40 or an equivalent device in a testing operation.

With continued reference to FIG. 1, by way of example, the battery management system 3 includes a battery data collector 30 connected thereto. In a preferred embodiment, the battery management system 3 or the battery data collector 30 electrically connects with the power charge/discharge devices 2. In a testing operation, the battery management system 3 is operated to set at least one discharge mode and at least one discharge condition of the battery set 1.

Figure 2:
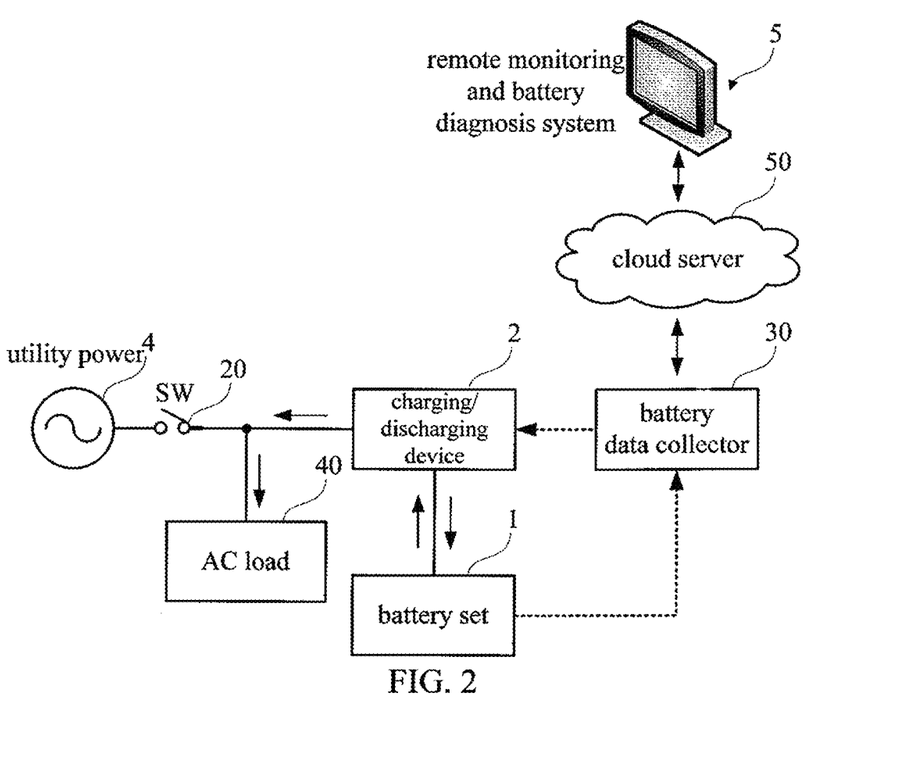
FIG. 2 is a block diagram of a battery state detection system in accordance with a second preferred embodiment of the present invention.

FIG. 2 shows a block diagram of a battery state detection system in accordance with a second preferred embodiment of the present invention, corresponding to that shown in FIG. 1. Turning now to FIG. 2, in comparison with the first embodiment, the battery state detection system of the second preferred embodiment of the present invention further includes the battery management system 3 or the battery data collector 30 connecting with a remote monitoring and battery diagnosis system 5 or a cloud server 50.

Figure 3:
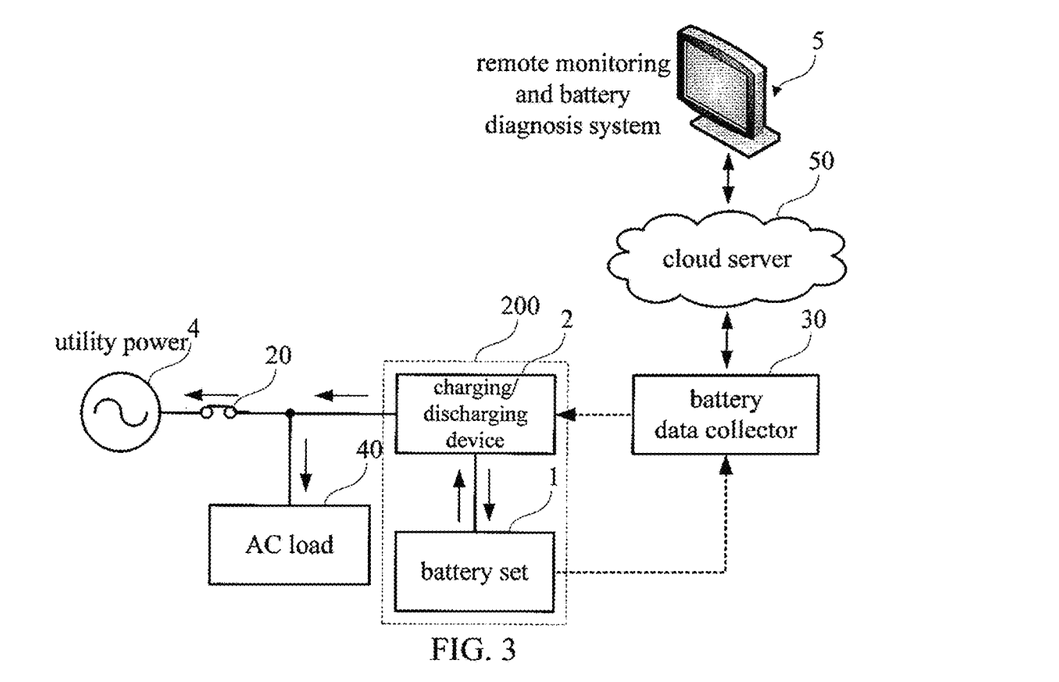
FIG. 3 is a block diagram of a battery state detection system in accordance with a third preferred embodiment of the present invention.

FIG. 3 shows a block diagram of a battery state detection system in accordance with a third preferred embodiment of the present invention, corresponding to that shown in FIG. 1. Turning now to FIG. 3, in comparison with the first embodiment, the battery state detection system of the third preferred embodiment of the present invention further includes the battery set 1 and the power charge/discharge devices 2 arranged in an energy storage system 200, an energy recycle system or other equivalent system, including an uninterruptible power supply system, a switching mode rectifier system and a backup power supply system. In a preferred embodiment, the battery set 1 of the energy storage system 200 is capable of reversely supplying power to the utility power system 4 or supplying power to the AC load 40, as shown in the left side in FIG. 3.

Figure 4:
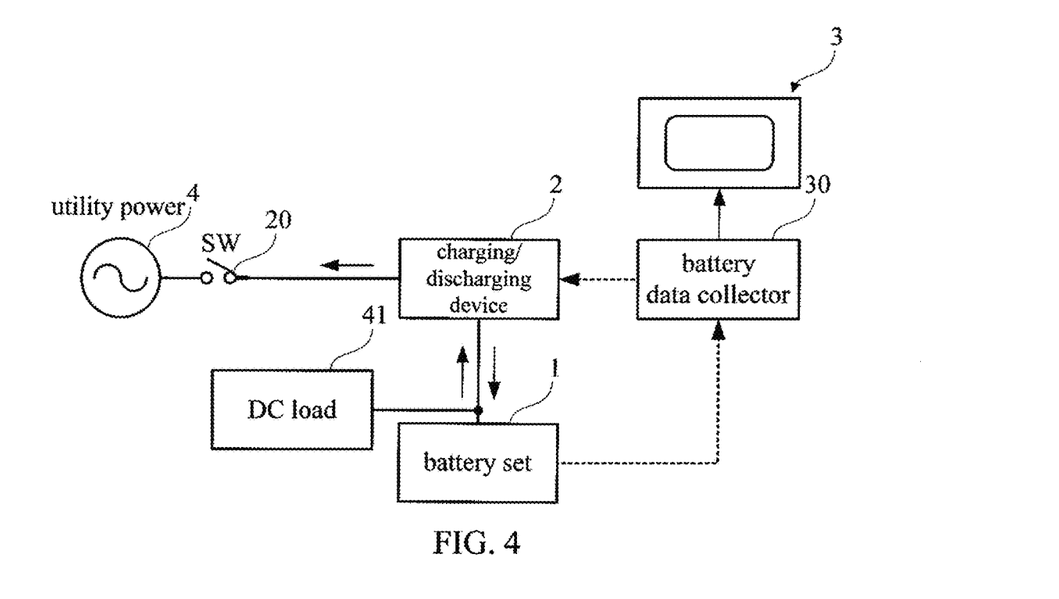
FIG. 4 is a block diagram of a battery state detection system in accordance with a fourth preferred embodiment of the present invention.

FIG. 4 shows a block diagram of a battery state detection system in accordance with a fourth preferred embodiment of the present invention, corresponding to that shown in FIG. 1. Turning now to FIG. 4, in comparison with the first embodiment, the battery state detection system of the fourth preferred embodiment of the present invention further includes the power charge/discharge devices 2 manually or automatically controlling the battery set 1 to supply power to a DC load 41 or an equivalent DC device via the battery management system 3 or the battery data collector 30.

Figure 5:
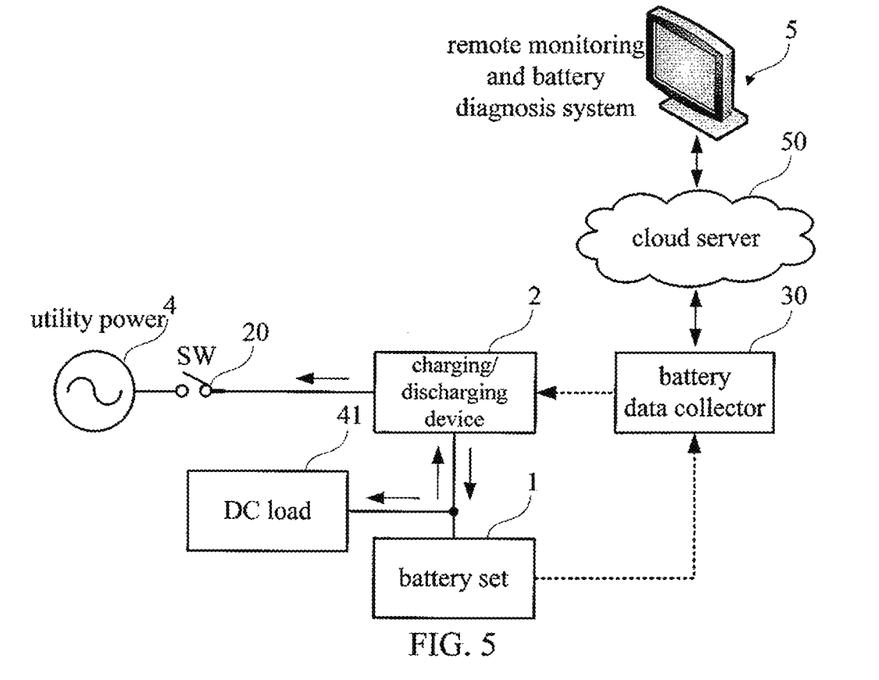
FIG. 5 is a block diagram of a battery state detection system in accordance with a fifth preferred embodiment of the present invention.

FIG. 5 shows a block diagram of a battery state detection system in accordance with a fifth preferred embodiment of the present invention, corresponding to that shown in FIG. 2. Turning now to FIG. 5, in comparison with the second embodiment, the battery state detection system of the fifth preferred embodiment of the present invention further includes the power charge/discharge devices 2 remote-controlling the battery set 1 to supply power to the DC load 41 or an equivalent DC device via the remote monitoring and battery diagnosis system 5, or alternatively executing a remote diagnosis for the battery set 1.

Figure 6:
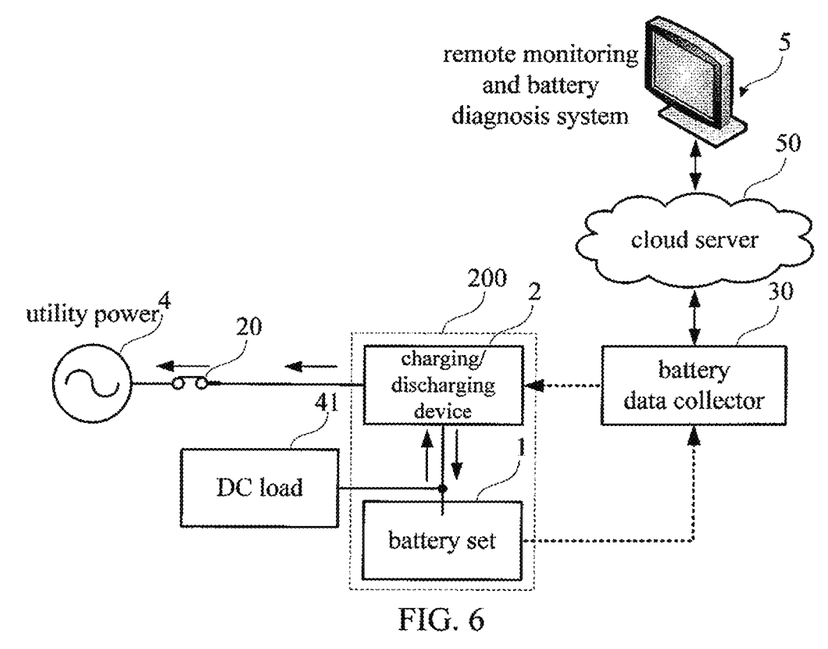
FIG. 6 is a block diagram of a battery state detection system in accordance with a sixth preferred embodiment of the present invention.

FIG. 6 shows a block diagram of a battery state detection system in accordance with a sixth preferred embodiment of the present invention, corresponding to that shown in FIG. 3. Turning now to FIG. 6, in comparison with the third embodiment, the battery state detection system of the fifth preferred embodiment of the present invention further includes the power charge/discharge devices 2 to control the battery set 1 of the energy storage system 200 for reversely supplying power to the utility power system 4 or supplying power to the AC load 40.

Figure 7A:
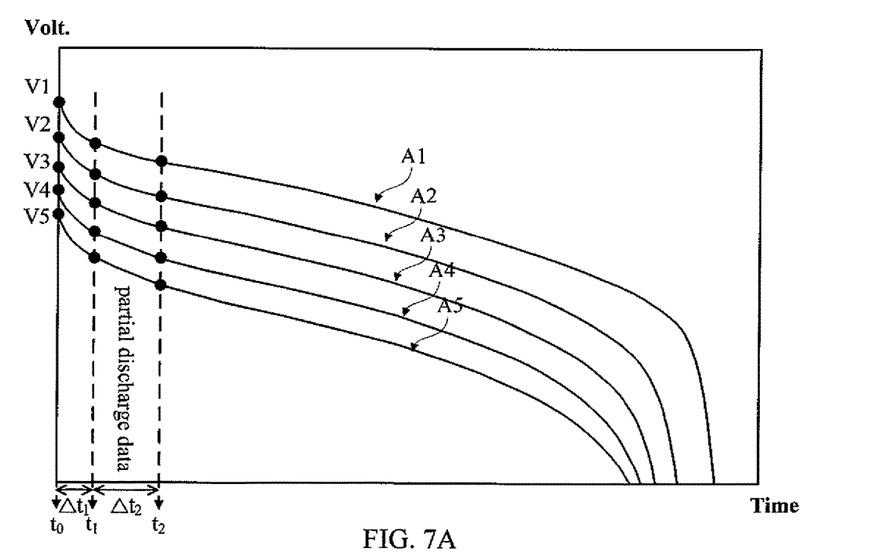
FIG. 7A is a chart of battery discharge voltage in relation to time applied in the battery state detection system in accordance with the preferred embodiment of the present invention.

FIG. 7A shows a chart of battery discharge voltage in relation to time applied in the battery state detection system in accordance with the preferred embodiment of the present invention. Referring now to FIGS. 1 and 7A, the battery state detection method of the preferred embodiment of the present invention includes the step of: presetting at least one discharge mode and at least one discharge condition of the battery set 1 via the power charge/discharge device 2 or the battery management system 3 for calculating and estimating a battery state with a partial discharge manner to simplify a procedure of testing, to avoid a complete discharge of testing, to minimize an operation time of testing and to reduce a testing cost. The discharge mode includes a predetermined voltage mode, a predetermined current mode, a predetermined power mode, an unvaried power mode or combinations thereof. The discharge condition includes a discharge voltage, a discharge time, a relative variation of battery impedance or combinations thereof.

With continued reference to FIG. 7A, by way of example, five discharge conditions (e.g. voltages V1, V2, V3, V4, V5 or currents A1, A2, A3, A4, A5) are preset to execute partial discharge five or more times corresponding to five different discharge curves which are pre-stored in the battery management system 3 or the remote monitoring and battery diagnosis system 5 and suitable for estimating a battery state of the battery set 1. In verification, a section of one of the discharge curves (partial discharge time $t_1$ to $t_2$) is selected to verify with at least one partial discharge data or an estimated battery state data to simplify a calculation process.

Referring again to FIG. 7A, by way of example, a first discharge condition and a second discharge condition selectively match with a single discharge curve or two different discharge curves. In another embodiment, a plurality of discharge conditions can selectively match with identical numbers of different discharge curves.

Referring again to FIGS. 1 and 7A, the battery state detection method of the preferred embodiment of the present invention includes the step of: executing an initially partial discharge procedure of the battery set 1 for a first predetermined discharge time $\Delta t_1$ (partial discharge time $t_0$ to $t_1$) with a first predetermined discharge voltage or a first predetermined relative variation of battery impedance via the power charge/discharge device 2 or the battery management system 3 to at least one predetermined device (e.g. a load or an energy recycle system), and measuring initially partial discharge data to verify with a normal or abnormal state (e.g. abnormal discharge voltage or current data) of the battery set 1. The battery state detection method is terminated to save testing time if the initially partial discharge data is abnormal.

With continued reference to FIGS. 1 and 7A, the battery state detection method of the preferred embodiment of the present invention includes the step of: executing a primarily partial discharge procedure of the battery set 1 for a second predetermined discharge time $\Delta t_2$ (partial discharge time $t_1$ to $t_2$) with a second predetermined discharge voltage or a second predetermined relative variation of battery impedance via the power charge/discharge device 2 or the battery management system 3 when the battery set 1 is normal, and measuring primarily partial discharge data. In a preferred embodiment, the second predetermined discharge time $\Delta t_2$ serially connects with the first predetermined discharge time $\Delta t_1$ to form a time series of partial discharge processes, as indicated at the dotted lines in FIG. 7A.

Referring now to FIGS. 1, 2 and 7A, the battery state detection method of the preferred embodiment of the present invention includes the step of: directly calculating an estimated battery state data with the primarily partial discharge data (based on preset discharge-related voltage (current or power) data or preset discharge curve-related voltage (current or power) data) with the discharge mode and the discharge condition in one of the battery management system 3 and the remote monitoring and battery diagnosis system 5 to avoid utilizing a conventional complicated algorithm, as described in U.S. patent application publication No. 20140153134. The battery state data includes a state of health, a state of charge, a residual discharge time or combinations thereof.

Figure 7B:
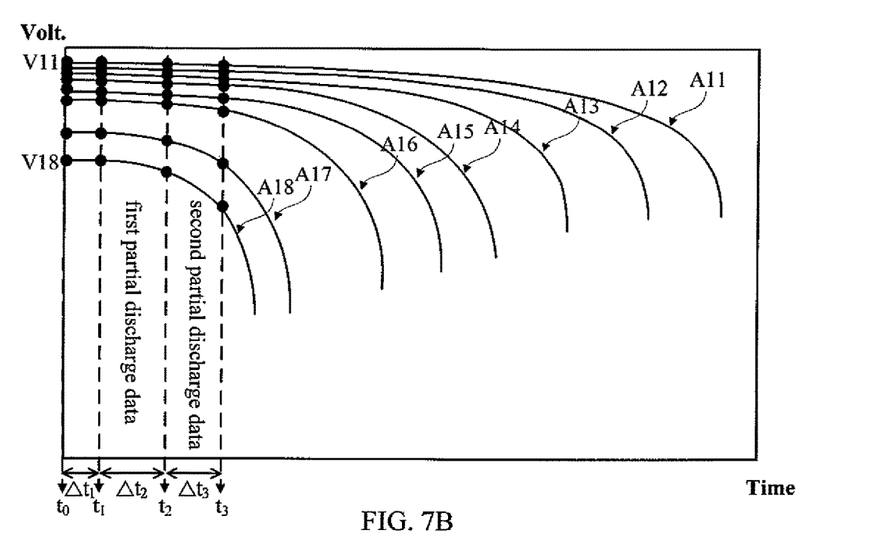
FIG. 7B is another chart of battery discharge voltage in relation to time applied in the battery state detection system in accordance with the preferred embodiment of the present invention.

FIG. 7B shows another chart of battery discharge voltage in relation to time applied in the battery state detection system in accordance with the preferred embodiment of the present invention. Referring now to FIGS. 1 and 7B, the battery state detection method of the preferred embodiment of the present invention includes the step of: presetting at least two discharge modes and at least two discharge conditions of another type (e.g. another brand or model) of the battery set 1 via the power charge/discharge device 2 or the battery management system 3 for calculating and estimating a battery state with a partial discharge manner to simplify a procedure of testing, to avoid a complete discharge of testing, to minimize an operation time of testing and to reduce testing cost. The discharge mode includes a predetermined voltage mode, a predetermined current mode, a predetermined power mode, an unvaried power mode or combinations thereof. The discharge condition includes a discharge voltage, a discharge time, a relative variation of battery impedance or combinations thereof.

With continued reference to FIGS. 1 and 7B, by way of example, eight discharge conditions (e.g. voltages V11, V12, V13, V14, V15, V16, V17, V18 or currents A11, A12, A13, A14, A15, A16, A17, A18) are preset to execute partial discharge eight or more times corresponding to eight different discharge curves which are pre-stored in the battery management system 3 or the remote monitoring and battery diagnosis system 5 and suitable for estimating a battery state of the battery set 1. In verification, a plurality of sections of discharge curves (partial discharge time $t_1$ to $t_2$ or $t_2$ to $t_3$) is selected to verify with at least one partial discharge data or an estimated battery state data to simplify a calculation process.

With continued reference to FIGS. 1 and 7B, the battery state detection method of the preferred embodiment of the present invention includes the step of: executing an initially partial discharge procedure of another type of the battery set 1 for a first predetermined discharge time $\Delta t_1$ (partial discharge time $t_0$ to $t_1$) with a first predetermined discharge voltage or a first predetermined relative variation of battery impedance via the power charge/discharge device 2 or the battery management system 3, and measuring initially partial discharge data to verify a normal or abnormal state (e.g. abnormal discharge voltage or current) of the battery set 1. The battery state detection method is terminated to save testing time if the initially partial discharge data is abnormal.

With continued reference to FIGS. 1 and 7B, the battery state detection method of the preferred embodiment of the present invention includes the step of: executing a first partial discharge procedure of another type of the battery set 1 for a second predetermined discharge time $\Delta t_2$ (partial discharge time $t_1$ to $t_2$) with a second predetermined discharge voltage or a second predetermined relative variation of battery impedance via the power charge/discharge device 2 or the battery management system 3 when the battery set 1 is normal, and measuring first partial discharge data.

With continued reference to FIGS. 1 and 7B, the battery state detection method of the preferred embodiment of the present invention includes the step of: executing a second partial discharge procedure of another type of the battery set 1 for a third predetermined discharge time $\Delta t_3$ (partial discharge time $t_2$ to discharge terminal time $t_3$) with a third predetermined discharge voltage or a third predetermined relative variation of battery impedance via the power charge/discharge device 2 or the battery management system 3, and measuring second partial discharge data. In a preferred embodiment, the first predetermined discharge time $\Delta t_1$, the second predetermined discharge time $\Delta t_2$ and the third predetermined discharge time $\Delta t_3$ are serially connected, as indicated at the dotted lines in FIG. 7B.

Referring now to FIGS. 1, 2 and 7B, the battery state detection method of the preferred embodiment of the present invention includes the step of: directly calculating an estimated battery state data with the first partial discharge data and the second partial discharge data with the two discharge modes and the two discharge conditions in one of the battery management system 3 and the remote monitoring and battery diagnosis system 5. The battery state data includes a state of health, a state of charge, a residual discharge time or combinations thereof.

In a verification operation, the estimated battery state data, the first partial discharge data and the second partial discharge data are selectively compared with a partial discharge data of a plurality of predetermined sections of a single discharge curve. In another embodiment, the estimated battery state data, the first partial discharge data and the second partial discharge data can also be compared with a partial discharge data of a plurality of predetermined sections of two discharge curves.

Figure 7C:
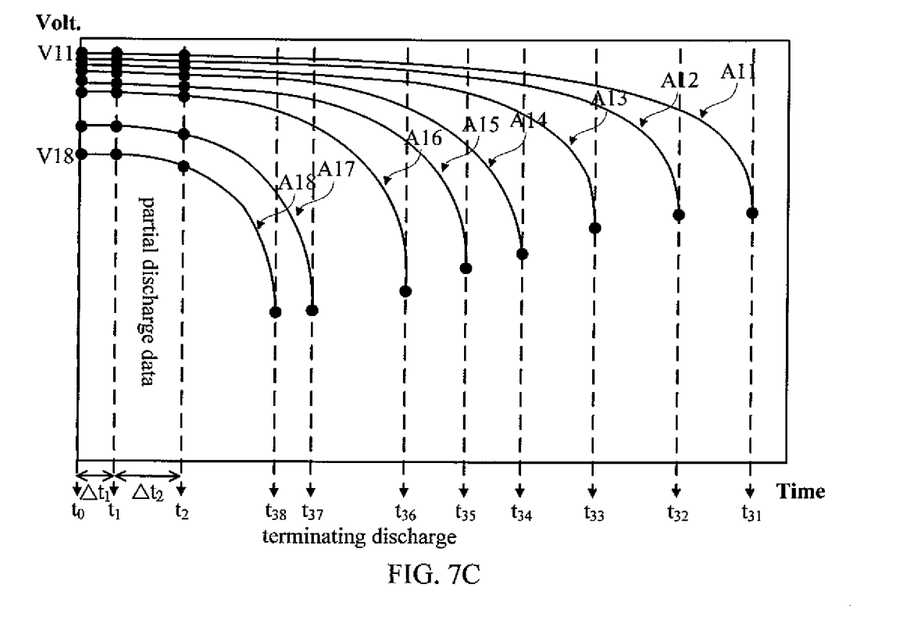
FIG. 7C is a chart of battery discharge voltage in relation to time for verification with terminal discharge voltages applied in the battery state detection system in accordance with a preferred embodiment of the present invention.

FIG. 7C shows a chart of battery discharge voltage in relation to time for verification with terminal discharge voltages applied in the battery state detection system in accordance with a preferred embodiment of the present invention. Referring now to FIGS. 1 and 7C, eight discharge conditions (e.g. voltages V11, V12, V13, V14, V15, V16, V17, V18 or currents A11, A12, A13, A14, A15, A16, A17, A18) are preset to execute partial discharge eight or more times corresponding to eight different discharge curves which are pre-stored in the battery management system 3 or the remote monitoring and battery diagnosis system 5 and suitable for estimating a battery state of the battery set 1. In verification, a plurality of battery state data discharged to various terminal discharge voltages (discharge time $t_2$-$t_{31}$, $t_2$-$t_{32}$, $t_2$-$t_{33}$, $t_2$-$t_{34}$, $t_2$-$t_{35}$, $t_2$-$t_{36}$, $t_2$-$t_{37}$, or $t_2$ to $t_{38}$) is selected to verify with the partial discharge data or the estimated battery state data of the battery set 1.

Although the invention has been described in detail with reference to its presently preferred embodiments, it will be understood by one of ordinary skill in the art that various modifications can be made without departing from the spirit and the scope of the invention, as set forth in the appended claims.

What is claimed is:

1. A battery state detection method comprising:
presetting at least one discharge mode and at least one discharge condition of a battery set for estimating a battery state with a partial discharge manner;
executing an initially partial discharge procedure of the battery set for a first predetermined discharge time with a first predetermined discharge voltage or a first predetermined relative variation of battery impedance, and measuring initially partial discharge data to verify a normal or abnormal state of the battery set, and immediately terminating execution of further power discharge and saving testing time when identifying the battery set is abnormal;
further executing a primarily partial discharge procedure of the battery set for a second predetermined discharge time within two predetermined time points with a second predetermined discharge voltage or a second predetermined relative variation of battery impedance when identifying the battery set is normal, and further measuring primarily partial discharge data; and
directly calculating an estimated detail battery state data with the primarily partial discharge data within two predetermined time points with the at least one discharge mode and the at least one discharge condition.

2. The battery state detection method as defined in claim 1, wherein estimating the battery state includes estimating a state of health, a state of charge, a residual discharge time or combinations thereof.

3. The battery state detection method as defined in claim 2, wherein the battery set includes a lead-acid battery set, an aqueous hybrid iron battery set, a silicon carbide battery set, a nickel manganese cobalt lithium battery set or a lithium-iron battery set.

4. The battery state detection method as defined in claim 1, further comprising arranging the battery set in an uninterruptible power supply system, a switching mode rectifier system, a backup power supply system, an energy storage system or an energy recycle system.

5. The battery state detection method as defined in claim 1, wherein the at least one discharge mode includes a predetermined voltage mode, a predetermined current mode, a predetermined power mode, an unvaried power mode or combinations thereof.

6. The battery state detection method as defined in claim 1, wherein the at least one discharge condition includes a discharge voltage, a discharge time, a relative variation of battery impedance or combinations thereof.

7. The battery state detection method as defined in claim 1, further comprising verifying the estimated battery state data by a battery state data which is discharged to a terminal voltage under the at least one discharge condition.

8. The battery state detection method as defined in claim 1, further comprising combining a power charge/discharge device and a battery managing system to form a manual operation monitoring system, a remote monitoring system or an automatic time-schedule control system.

9. A battery state detection method comprising:
presetting at least one discharge mode and at least one discharge condition of a battery set for estimating a battery state with a partial discharge manner;
executing an initially partial discharge procedure of the battery set for a first predetermined discharge time with a first predetermined discharge voltage or a first predetermined relative variation of battery impedance, and measuring initially partial discharge data to verify a normal or abnormal state of the battery set;
executing a first partial discharge procedure of the battery set for a second predetermined discharge time with a second predetermined discharge voltage or a second predetermined relative variation of battery impedance when the battery set is normal, and measuring first partial discharge data;
executing a second partial discharge procedure of the battery set for a third predetermined discharge time with a third predetermined discharge voltage or a third predetermined relative variation of battery impedance, and measuring second partial discharge data; and
directly calculating an estimated battery state data with the first partial discharge data and/or the second partial discharge data with the at least one discharge mode and the at least one discharge condition.

10. The battery state detection method as defined in claim 9, wherein estimating the battery state includes estimating a state of health, a state of charge, a residual discharge time or combinations thereof.

11. The battery state detection method as defined in claim 9, wherein the battery set includes a lead-acid battery set, an aqueous hybrid iron battery set, a silicon carbide battery set, a nickel manganese cobalt lithium battery set or a lithium-iron battery set.

12. The battery state detection method as defined in claim 9, further comprising arranging the battery set in an uninterruptible power supply system, a switching mode rectifier system, a backup power supply system, an energy storage system or an energy recycle system.

13. The battery state detection method as defined in claim 9, wherein the at least one discharge mode includes a predetermined voltage mode, a predetermined current mode, a predetermined power mode, an unvaried power mode or combinations thereof.

14. The battery state detection method as defined in claim 9, wherein the at least one discharge condition includes a first discharge condition and a second discharge condition which includes a discharge voltage, a discharge time, a relative variation of battery impedance or combinations thereof.

15. The battery state detection method as defined in claim 9, further comprising verifying the first partial discharge data, the second partial discharge data or the estimated battery state data by a battery state data which is discharged to a terminal voltage under the discharge condition.

16. The battery state detection method as defined in claim 9, further comprising combining the battery set, a power charge/discharge device and a battery managing system to form a manual operation monitoring system, a remote monitoring system or an automatic time-schedule control system.

17. A battery state detection system comprising:
a battery set provided in a predetermined device;
at least one power charge/discharge device having a control unit electrically connected with the battery set; and
a battery managing system electrically connected with the power charge/discharge device, with at least one discharge mode and at least one discharge condition of the battery set preset in the battery managing system;
wherein the at least one power charge/discharge device is configured to execute an initially partial discharge procedure of the battery set for a first predetermined discharge time with a first predetermined discharge voltage or a first predetermined relative variation of battery impedance, with the at least one power charge/discharge device configured to immediately terminate execution of further power discharge for saving testing time when identifying the battery set is abnormal;
wherein the at least one power charge/discharge device is configured to measure initially partial discharge data to verify a normal or abnormal state of the battery set;
wherein the at least one power charge/discharge device is configured to further execute a primarily partial discharge procedure of the battery set for a second predetermined discharge time within two predetermined time points with a second predetermined discharge voltage or a second predetermined relative variation of battery impedance when identifying the battery set is normal, and is configured to measure primarily partial discharge data; and
wherein the control unit is configured to directly calculate an estimated detail battery state data by the primarily partial discharge data with the at least one discharge mode and the at least one discharge condition.

18. The battery state detection system as defined in claim 17, wherein the battery state includes a state of health, a state of charge, a residual discharge time or combinations thereof.

19. The battery state detection system as defined in claim 17, wherein the battery set includes a lead-acid battery set, an aqueous hybrid iron battery set, a silicon carbide battery set, a nickel manganese cobalt lithium battery set or a lithium-iron battery set.

20. The battery state detection system as defined in claim 17, wherein the battery set is arranged in an uninterruptible power supply system, a switching mode rectifier system, a backup power supply system, an energy storage system or an energy recycle system.

21. The battery state detection system as defined in claim 17, wherein the discharge mode includes a predetermined voltage mode, a predetermined current mode, a predetermined power mode, an unvaried power mode or combinations thereof.

22. The battery state detection system as defined in claim 17, wherein the at least one discharge condition includes a discharge voltage, a discharge time, a relative variation of battery impedance or combinations thereof.

23. The battery state detection system as defined in claim 17, wherein the control unit is configured to verify the estimated battery state data by a battery state data which is discharged to a terminal discharge voltage under the at least one discharge condition.

24. The battery state detection system as defined in claim 17, wherein the battery managing system includes a battery data collector connected thereto.

25. The battery state detection system as defined in claim 24, wherein the battery managing system or the battery data collector connects with a remote monitoring and battery diagnosis system.

26. The battery state detection system as defined in claim 17, wherein the at least one power charge/discharge device and the battery managing system are combined to form a manual operation monitoring system, a remote monitoring system or an automatic time-schedule control system.

* * * * *